United States Patent [19]

Shaw et al.

[11] Patent Number: 4,652,079

[45] Date of Patent: Mar. 24, 1987

[54] HIGH SPEED PULSE TRAIN GENERATOR

[75] Inventors: Herbert J. Shaw, Stanford; Steven A. Newton, Menlo Park, both of Calif.

[73] Assignee: The Board of Trustees of the Leland Stanford Junior University, Stanford, Calif.

[21] Appl. No.: 527,163

[22] Filed: Aug. 26, 1983

[51] Int. Cl.⁴ .............................................. G02B 6/26
[52] U.S. Cl. ............................... 350/96.15; 350/96.16
[58] Field of Search ........................... 350/96.15, 96.16

[56] References Cited

U.S. PATENT DOCUMENTS

| 4,136,929 | 1/1979 | Suzaki | 350/96.15 |
| 4,261,639 | 4/1981 | Kogelnik et al. | 350/96.30 X |
| 4,315,666 | 2/1982 | Hicks, Jr. | 350/96.15 |
| 4,529,262 | 7/1985 | Ashkin et al. | 350/96.29 X |

FOREIGN PATENT DOCUMENTS

| 0079196 | 5/1983 | European Pat. Off. . |
| 0078140 | 5/1983 | European Pat. Off. . |
| 0116951 | 9/1979 | Japan | 350/96.15 |

OTHER PUBLICATIONS

L. F. Stokes, et al, "All-Single-Mode Fiber Resonator," Optics Letters, vol. 7, No. 6, Jun. 1982, pp. 288-290.

Primary Examiner—John Lee
Assistant Examiner—L. Rushin
Attorney, Agent, or Firm—Knobbe, Martens, Olson & Bear

[57] ABSTRACT

There is disclosed a high speed pulse train generator for generating a train of pulses having arbitrarily close spacing. The apparatus consists of a generator loop comprised of a fiber optic waveguide looped through a directional coupler with the output fiber serving as the input fiber for a similarly structured multiplexer loop. The lengths of the two loops are adjusted such that the time difference in the propagation times of light around the respective loops is small compared to the time of propagation around either loop. The times are adjusted to obtain any arbitrary spacing of the pulses in the output pulse train which is comprised of interleaved pulse trains resulting from each pulse input to the multiplexer loop. Also disclosed is a single loop embodiment for bidirectional data rate transformation and methods of using all the embodiments.

32 Claims, 25 Drawing Figures

LATERAL OFFSET

HIGH SPEED PULSE TRAIN GENERATOR

BACKGROUND OF THE INVENTION

The invention relates generally to fiber optic delay lines, and, specifically to high speed pulse train generation using such fiber optic delay lines.

It is useful to be able to generate trains of short laser pulses which are spaced by very short time intervals. These pulse trains can be used to define observation windows for physical phenomenon which have very short durations. These short pulses, spaced together in pulse trains, can also be used to transfer data at a very high data rate.

A variety of techniques are presently known for generation of trains of short laser pulses. However, the repetition period of the pulse train, i.e., the spacing between the pulses in the pulse train, is generally large compare to the duration of the pulse itself in these prior art techniques. For example, when well known laser mode locking techniques are used, the maximum repetition frequency is usually limited to a small integer multiple of the inverse round trip transit time for the light in the resonant cavity of the laser. Therefore, the size of the resonant cavity limits the closeness of the pulse spacing and therefore the pulse spacing of the pulse train so generated. Even the smallest semi-conductor lasers can not produce pulse trains having arbitrarily close spacing between the pulses such as would be desirable for some applications.

It is desirable then to have a high speed pulse train generator which can convert a single input pulse into a train of arbitrarily closely spaced output pulses or which can compress an input pulse train into a series of output pulse trains having arbitrarily closely spaced pulses within each train. The present invention is the first demonstration of a simple apparatus and technique for generating high speed pulse trains having arbitrarily closely spaced pulses using single mode fiber optic recirculating delay lines. Such recirculating delay lines have been described in several commonly assigned, co-pending patent applications, namely: Splice-Free Fiber Optic Recirculating Memory, Ser. No. 314,473, now U.S. Pat. No. 4,473,270, filed Oct. 23, 1981; Tapped Optical Fiber Delay Line, Ser. No. 323,038, now U.S. Pat. No. 4,558,920, filed Nov. 19, 1981; and Fiber Optic Switch and Discretely Variable Delay Line, Ser. No. PCT-US82-01608, filed Nov. 12, 1982.

SUMMARY OF THE INVENTION

The invention is a data rate transformation device and high speed pulse train generator and a method for generating closely spaced pulse trains by interleaving, i.e., by overlaying independent output pulse trains where each output pulse train is generated in response to a particular input pulse. In the preferred embodiment, the high speed pulse train generator consists of a first delay line designated the generator loop. The generator loop utilizes a directional coupler having a single mode fiber optic waveguide mounted in a groove of a quartz block. The fiber forms a loop of sufficient dimensions to cause a predetermined delay for light propagating around the loop and re-enters the coupler by passing through the a groove in a second quartz block. The fiber optic wave guide exiting from this first coupler is coupled to the input of a second directional coupler which has the same structure as the first coupler, and includes a fiber loop similar to the generator loop, except that the length of this loop is slightly different than that of the generator loop. This second loop is designated the multiplexer loop. The different length of the multiplexer loop causes a data rate transformation which can be adjusted by varying the length of the loop to provide an output pulse train with pulses closely spaced at predetermined intervals.

In operation, a single input pulse is injected into the fiber entering the input port of the first directional coupler. This input light pulse is partially coupled to the fiber exiting from the first directional coupler while part of the input pulse power remains in the input fiber and passes through the generator loop. Upon returning from the first revolution through the generator loop, the coupled power re-enters the directional coupler and part of the power exits the coupler as a second pulse in the output pulse train resulting from the single input pulse. The remainder of the power not exiting from the first coupler is coupled back into the generator loop. Each time the circulating pulse in the generator loop reaches the first directional coupler, part of the power is coupled back into the loop, and part of the power exits from the first directional coupler to become another pulse in the output pulse train from the generator loop. Thus the generator loop generates a decaying pulse train where the pulses are separated in time by an interval equal to the transit time of the light pulse around the perimeter of the generaftor loop. The output pulse train from the generator loop is decaying, because as each pulse exits from the loop and re-enters the first directional coupler, part of its power is coupled back into the loop, and only the remainder exits the first directional coupler as a pulse.

The decaying pulse train from the generator loop becomes the input pulse train for the muliplexer loop. The multiplexer loop, however, has a different length than the generator loop. The difference in length may be selected to be any arbitrary value, and this length difference determines the spacing of the pulses in the multiple pulse trains which are output from the multiplexer loop. The multiplexer loop and the second directional coupler process each pulse in its input pulse train in the same fashion as the generator loop processed the single original input pulse. Therefore, a portion of each pulse in the input pulse train will recirculate in the loop, while the remaining portion of that pulse will pass straight through the second coupler without recirculation. Because of this recirculation each pulse in the input pulse train to the multiplexer loop generates a decaying pulse train in the same manner that the generator loop produced a decaying pulse train. However, the pulse trains generated by each input pulse recirculating in the multiplexer loop are interleaved, with the non-recirculated pulses that pass straight through the second coupler, because of the length difference between the multiplexer loop and the generator loop. The multiplexer loop therefore outputs a series of pulse trains where each pulse train is separated by the transit time of the multiplexer loop, and wherein the pulses in each pulse train are separated by the time that it takes a light pulse to traverse the difference in length between the multiplexer loop and the generator loop. This time can be arbitrarily small and is adjustable merely by changing the length of the multiplexer loop relative to the generator loop.

DESCRIPTION OF THE DRAWINGS

FIG. 5 is a graph of (a) normalized coupled power as a function of lateral offset and (b) throughout loss as a function of lateral offset for one exemplary coupler showing that the throughput loss is substantially constant over substantially the entire range of normalized coupled power.

DETAILED DESCRIPTION OF THE PREFERRED EMBODIMENT CONSTRUCTION OF EVANESCENT FIELD COUPLER

As illustrated in FIGS. 1 to 4, an evanescent coupler 10 includes two strands 12a and 12b of a single mode fiber optic material mounted in longitudinal arcuate grooves 13a and 13b, respectively, formed in optically flat, confronting surfaces 14a and 14b, respectively, of rectangular bases or blocks 16a and 16b, respectively. The block 16a with the strand 12a mounted in the groove 13 will be referred to as the coupler half 10a, and the block 16b with the strand 12b mounted in the groove 13b will be referred to as the coupler half 10b.

Each of the strands 12a and 12b comprises a commercially available fiber of quartz glass which is doped to have a central core and an outer cladding. It will be seen below that the present invention is particularly advantageous for use with single mode fibers, which typically have a core diameter on the order of 10 microns or less and a cladding diameter on the order of 125 microns, although the invention may also be employed with other types of fibers, such as multi-mode fibers. In the embodiment disclosed, single mode fibers are utilized, however, for clarity of illustration, the diameter of the strands 12 and their respective cores are exaggerated. Furthermore, test results described herein are for couplers utilizing single mode fibers.

The arcuate grooves 13a and 13b have a radius of curvature which is very large compared to the diameter of the fibers 12, and have a width slightly larger than the fiber diameter to permit the fibers 12, when mounted therein, to conform to a path defined by the bottom walls of the grooves 13. The depth of the grooves 13a and 13b varies from a minimum at the center of the blocks 16a and 16b, respectively, to a maximum at the edges of the blocks 16a and 16b, respectively. This advantageously permits the fiber optic strands 12a and 12b, when mounted in the grooves 13a and 13b, respectively, to gradually converge toward the center and diverge toward the edges of the blocks 16a, 16b, thereby eliminating any sharp bends or abrupt changes in direction of the fibers 12 which may cause power loss through mode perturbation. In the embodiment shown, the grooves 13 are illustrated as being rectangular in cross-section, however, it will be understood that other suitable cross-sectional contours which will accommodated the fibers 12 may be used alternatively, such as a U-shaped cross-section or a V-shaped cross-section. Techniques for forming the grooves 13 and mounting the fibers 12 therein are discussed below.

At the centers of the blocks 16, in the embodiment shown, the depth of the grooves 13 which mount the strands 12 is less that the diameter of the strands 12, while at the edges of the blocks 16, the depth of the grooves is preferably at least as great as the diameter of the strands 12. Fiber optic material was removed from each of the strands 12a and 12b to form the respective oval-shaped planar surfaces 18a, 18b, which are coplanar with tne confronting surfaces 17a, 17b, respectively. These su. /aces 18a, 18b will be referred to herein as the fiber "facing surfaces". It will be understood that these facing surfaces provide a coupling area or region for the fibers 12a and 12b. Thus, the amount of fiber optic material removed increases gradually from zero towards the edges of the block 26 to a maximum towards the center of the block 16. This tapered removal of the fiber optic material enables the fibers to converge and diverge gradually, which is advantageous for avoiding backward reflection and excess loss of light energy.

In the evanescent coupler shown, the coupler halves 10a and 10b are identical, and are assembled by placing the confronting surfaces 14a and 14b of the blocks 16a and 16b together, so that the facing surfaces 18a and 18b of the strands 12a and 12b are in facing relationship.

An index matching substance (not shown), such as index matching oil, is provided between the confronting surfaces 14. This substance has a refractive index approximately equal to the refractive index of the cladding, and also functions to prevent the optically flat surfaces 14 from becoming permanently locked together. The oil is introduced between the blocks 16 by capillary action.

Figure 5:
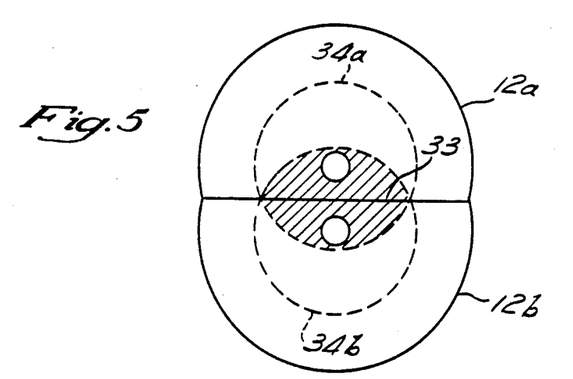
FIG. 5 is a schematic diagram showing the evanescent fields of the pair of fibers overlapping at the interaction region.

An interaction or coupling region 32 is formed at the junction of the strands 12, in which light is transferred between the strands by evanescent field coupling. It has been found that, to insure proper evanescent field coupling, the amount of material removed from the fibers 12 must be carefully controlled so that the spacing between the core portions of the strands 12 is within a predetermined "critical zone". The evanescent fields extend into the cladding and decrease rapidly with distance outside their respective cores. Thus, sufficient material should be removed to permit each core to be positioned substantially within the evanescent field of the other. If too little material is removed, the cores will not be sufficiently close to permit the evanescent fields to cause the desired interaction of the guided modes, and thus, insufficient coupling will result. Conversely, if too much material is removed, the propagation characteristics of the fibers will be altered, resulting in loss of light energy due to mode perturbation. However, when the spacing between the cores of the strands 12 is within the critical zone, each strand receives a significant portion of the evanescent field energy from the other strand, and optimum coupling is achieved without significant energy loss. The critical zone is illustrated schematically in FIG. 5 as including that area, designed by the reference numeral 33, in which the evanescent fields, designated by reference numerals 34a and 34b, of the fibers 12a and 12b, respectively, overlap with sufficient strength to provide coupling, i.e., each core is within the evanescent field of the other. However, as previously indicated, mode perturbation occurs within the area when the cores are brought too close together. For example, it is believed that, for weakly guided modes, such as the $HE_{11}$ mode in single mode fibers, or high order modes in multi-mode fibers, such mode perturbation begins to occur when sufficient material is removed from the fibers 12 to expose their cores. Thus, the critical zone is defined as that area in which the evanescent fields 34 overlap with sufficient strength to cause coupling without substantial mode perturbation induced power loss.

The extent of the critical zone for a particular coupler is dependent upon a number of interrelated factors such as the parameters of the fiber itself and the geometry of the coupler. Further, for a single mode fiber having a step-index profile, the critical zone can be quite narrow. In a single mode fiber coupler of the type shown in FIGS. 1–4, for example, the required center-to-center spacing between the strands 12 at the center of the coupler is typically less than a few (e.g., 2-3) core diameters.

Typically, the strands 12a and 12b are (1) identical to each other, (2) have the same radius of curvature at the interaction region 32, and (3) have a equal amount of fiber optic material removed therefrom to form their respective facing surfaces 18a and 18b. Thus, the fibers 12 are symmetrical, through the interaction region 32, in the plane of the facing surfaces 18, so that the facing surfaces 18 are coextensive if superimposed. This insures that the two fibers 12a and 12b will have the same propagation characteristics at the intersaction region 32, and thereby avoids coupling attenuation associated with dissimilar propagation characteristics.

The blocks or bases 12 may be fabricated of any suitable rigid material. In a typical coupler, the bases 12 comprise generally rectangular blocks of fused quartz glass approximately one inch long, one inch wide, and 0.4 inches thick. The fiber optic stands 12 are typically secured in the slots 13 by suitable cement 38, such as epoxy glue. One advantage of the fused quartz blocks 16 is that they have a coefficient of thermal expansion similar to that of glass fibers, and this advantage is particularly important if the blocks 16 and fibers 12 are subjected to any heat treatment during the manufacturing process. Another suitable material for the block 16 is silicon, which also has excellent thermal properties for this application.

Operation of the Coupler 10

Figure 1:
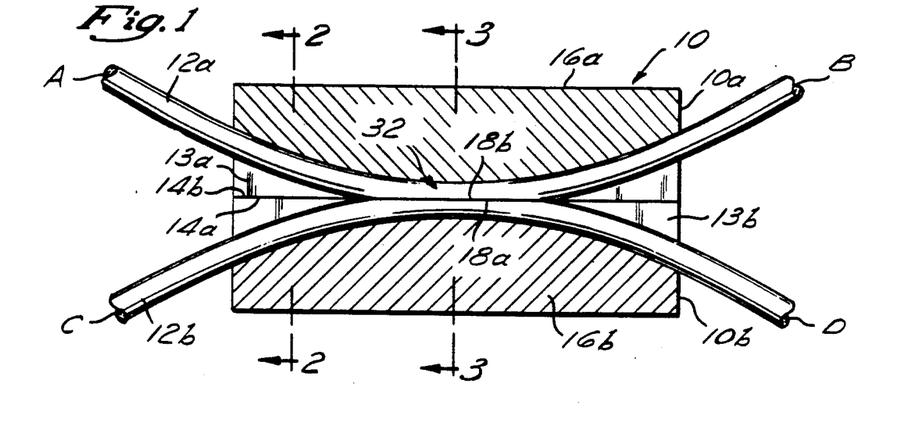
FIG. 1 is a cross-sectional view of the fiber optic coupler of the present invention, showing a pair of fiber optic strands mounted in respective arcuate grooves of respective coupler halves.
Figure 2:
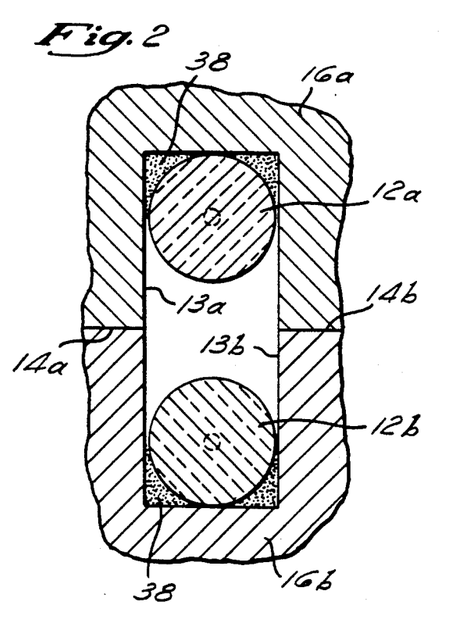
FIGS. 2 and 3 are cross-sectional views of the coupler of FIG. 1, taken along the lines 2—2 and 3—3, respectively.
Figure 3:
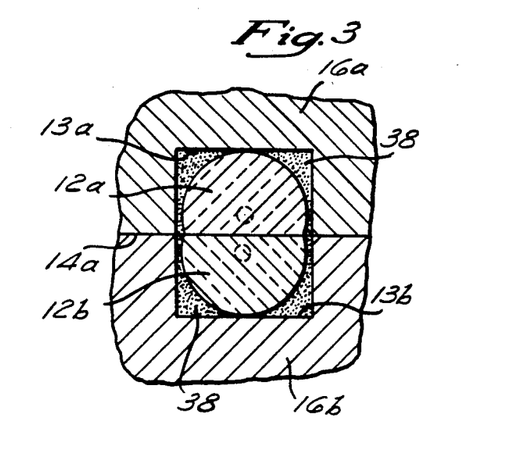
Figure 4:
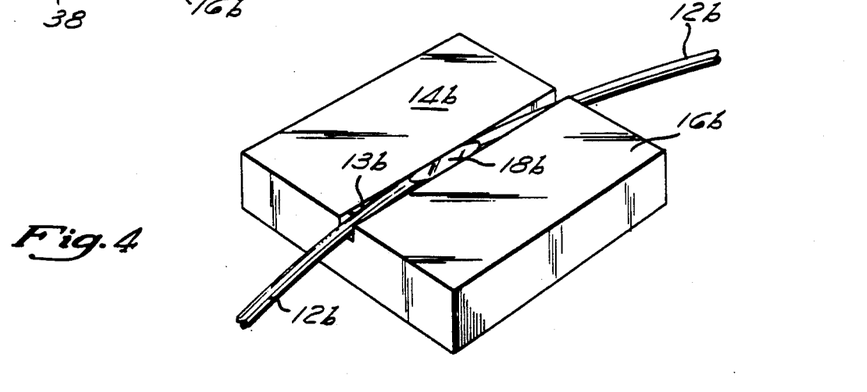
FIG. 4 is a perspective view of the lower base of the coupler of FIG. 1, separated from the other base, to show its associated fiber mounted thereon, and the oval-shaped, facing surface of the fiber.

The coupler 10 includes four pots, labeled A, B, C, and D in FIG. 1. When viewed from the perspective of FIG. 1, ports A and C, which correspond to strands 12a and 12b, respectively, are on the left hand side of the coupler 10, while the ports B and D, which correspond to the strands 12a and 12b, respectively, are on the right hand side of the coupler 10. For the purposes of discussion, it will be assumed that input light of a suitable wavelength (e.g., 1.15 microns) is applied to port A. This light passes through the coupler and is output at port B and/or port D, depending upon the amount of power that is coupled between the strands 12. In this regard, the term "normalized coupled power" is defined as the ratio of the coupled power to the total output power. In the above example, the normalized coupled power would be signal to the ratio of the power at port D to the sum of the power output at ports B and D. This ratio is also referred to as the "coupling efficiency", and when so used is typically expressed as a percent. Thus, when the term "normalized coupled power" is used herein, it should be understood that the corresponding coupling efficiency is equal to the normalized coupled power time one-hundred. In this regard, tests have shown that an evanescent coupler 10 may have a coupling efficiency of up to one-hundred percent. However, it will also be seen that the coupler 10 may be "tuned" to adjust the coupling efficiency to any desired value between zero and the maximum.

Furthermore, an evanescent coupler 10 is highly directional, with substantially all of the power applied at one side of the coupler being delivered to the other side of the coupler. The coupler directivity is defined as the ratio of the power at port D to the power at port C, with the input applied to port A. Tests have shown that the directionally coupled power (at port D) is greater than 60 dB above the contradirectionally coupled power (at port C). Further, the coupler directivity is symmetrical. That is, the coupler operates with the same characteristics regardless of which side of the coupler is the input side and which side is the output side. Moreover, the coupler 10 achieves these results with very low throughput losses. The throughput loss is defined as the ratio of the total output power (ports B and D) to the input power (port A), subtracted from one (i.e., $1-(P_B+P_D)/P_A$). Experimental results show that throughput losses of 0.2 dB have been obtained, although losses of 0.5 dB are more common. Moreover, these tests indicate that the coupler 10 operates substantially independently of the polarization of the input light applied.

The coupler 10 operates on evanescent field coupling principles in which guided modes of the strands 12 interact, through their evanescent fields, to cause light to be transferred between the strands 12. As previously indicated, this transfer of light occurs at the interaction region 32. The amount of light transferred is dependent upon the proximity and orientation of the cores, as well as the effective length of the interaction region 32. The length of the region 32 is, in turn, dependent upon the radius of curvature of the fibers 12, and, to a limited extent, upon the core spacing, although it has been found that the effective length of the interaction region 32 is substantially independent of core spacing. In one typical coupler 10, employing an edge-to-edge core spacing of about 1.4 microns, the radius of curvature is on the order of 25 centimeters, and the effective interaction region is approximately one millimeter long at a signal wavelength of 633 nm. With these dimensions, the light makes only one transfer between the strands 23 as it travels through the interaction region 32. However, if the length of the interaction region 32 is increased, or if core spacing is decreased, a phenomenon referred to herein as "overcoupling" will occur, in which the light will transfer back to the strand from which it originated. As the interaction length is further increased, and/or the cre spacing further decreased, the light transfers back to the other strand. Thus, the light may make multiple transfers back and forth between the two strands 12 as it travels through the region 32, the number of such transfers being dependent on the length of the interaction region 32, and the core spacing.

Figure 6:
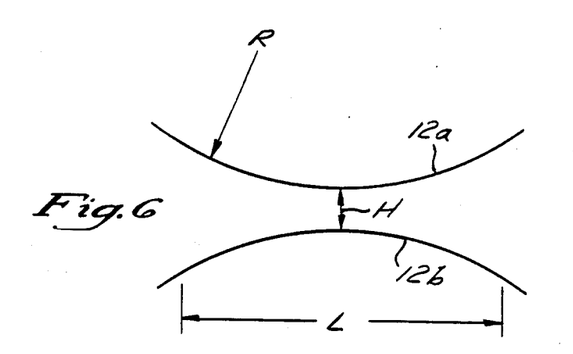
FIG. 6 is a schematic drawing of the coupler of FIG. 1, illustrating the radius of curvature, core spacing, and interaction length, as being parameters of the coupler.

The foregoing may be more fully understood through reference to FIG. 6 which shows a schematic representation of the coupler 10 in FIG. 1. The cores of fibers 12a and 12b are shown as gradually converging to a minimum spacing, labelled H, at the center of the coupler and diverging towards the edges of the coupler. The effective interaction length is labelled L and the radius of the curvature of the strands 12a and 12b is labelled R. As indicated above, it has been found that, while the effective interaction length L is a function of the radius of curvature R, it is substantially independent of the minimum spacing H between the fibers 12. Although this independence is truly valid only for relatively large core spacings and short wavelengths, it provides a good approximation for most applications, and thus, it advantageously permits the coupler, illustrated in FIG. 6, to be analyzed as an "equivalent" coupler comprising two parallel waveguides, separated through their interaction length L, by a spacing H, as shown in FIG. 7.

Figure 7:
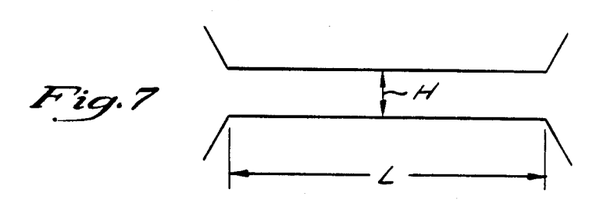
FIG. 7 is a schematic drawing of an "equivalent" coupler.
Figure 8:
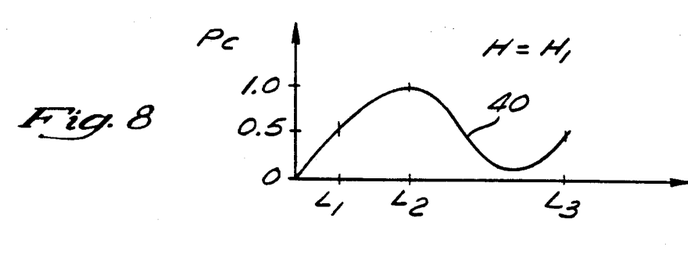
FIG. 8 is a graph of normalized coupled power as a function of interaction length for a given fiber core spacing.
Figure 9:
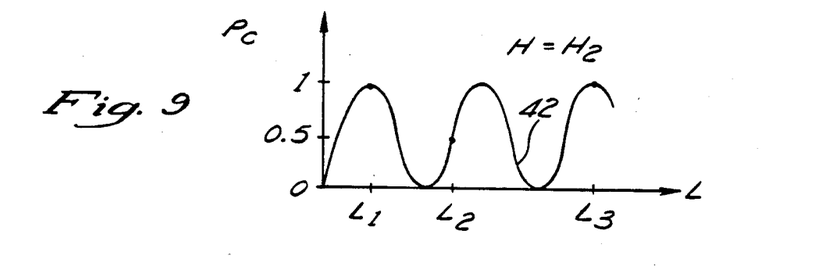
FIG. 9 is a graph of normalized coupled power as a function of interaction length for another fiber core spacing.

The effects of varying either the effective interaction length L or the fiber spacing H of the "equivalent" coupler shown in FIG. 7 may be understood through reference to FIGS. 8 and 9. FIG. 8 shows a sinusoidal curve 40 which illustrates that the coupled power $P_C$ varies sinusoidally as a function of the interaction length L for a given fiber spacing H1. At this fiber spacing, it may be seen that the coupled power is approximately fifty-percent when the intersection length is equal to L1, and increases to one-hundred-percent when the interaction length increases to L2. If the interaction length if further increased, "overcoupling" results, in which light is transferred back to the strand from which it originated, and the coupled power $P_C$ begins to decrease towards zero. The coupled power then increases from zero to, for example, fifty percent at L3. Thus, it may be seen that the amount of coupling may be varied by changing the effective length of the interaction region.

The effect of decreasing the spacing H between the fibers is to increase the strength of the coupling, and thus, increase the amount of light transferred over a given interaction length L, as shown by comparing the sinusoidal curve 42 of FIG. 9 with the sinusoidal curve of FIG. 8. For example, if the fiber spacing were decreased from $H_1$ (FIG. 8) to $H_2$ (FIG. 9), the coupled power may be one-hundred percent at interaction length L1 in FIG. 9, as compared to fifty percent for the same interaction length L1 in FIG. 8. The curve 42 indicates that the coupled power is again one-hundred percent. Thus, for a given interaction length (e.g., L1, L2, or L3), the amount of power coupled may be adjusted by changing the fiber core spacing.

Figure 10:
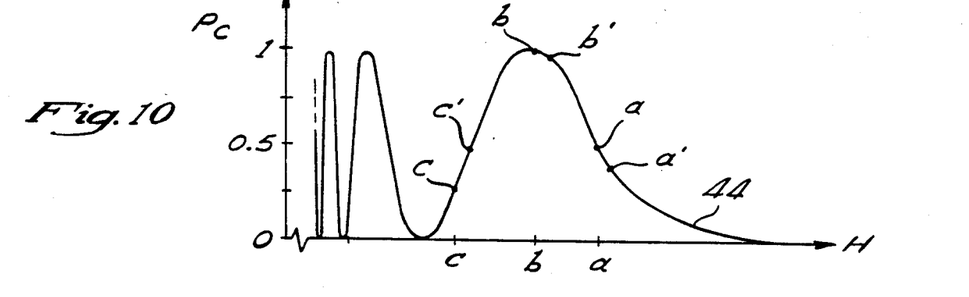
FIG. 10 is a graph of normalized coupled power as a function of minimum fiber core spacing (spacing surfaces superimposed)

The relationship between the minimum fiber spacing H and the coupled power $P_C$ for a given interaction length L (i.e., radius of curvature) is illustrated in FIG. 10 by the curve 44. As shown in this figure, the normalized coupled power oscillates between 0 and 1 with increasing frequency as the core spacing H decreases. The reference points a, b, and c on the curve H were chosen somewhat arbitrarily to indicate normalized coupled power of 0.5, 1.0, and 0.25, respectively. It will be recognized that at point "a", fifty percent of the power is coupled from one to the other. At point "b", full coupling is achieved, and one-hundred percent of the optical power is transferred between the strands. Point "c", on the other hand, represents an overcoupled condition wherein the coupled power has decreased from full coupling to twenty-five percent.

Tuning the Coupler 10

The foregoing concepts are useful in understanding the "tunability" aspects of the coupler 10. As used herein, the term "tuning" is defined as translating the fibers 12 relative to each other to adjust the power coupled therebetween. Such translation of the fibers 12 is accomplished by sliding the planar facing surfaces 18 relative to each other, so that they are offset, rather than superimposed. That is, the fibers 12 are mutually displaced in the plane of the planar facing surfaces. Viewed another way, such translation occurs when respective planes in which each of the fibers lie, are displaced relative to each other.

Figure 11:
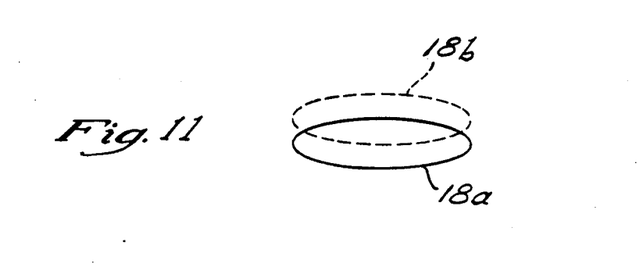
FIG. 11 is a schematic representation of the oval-shaped facing surfaces of the fibers, showing the facing surfaces laterally offset.

In one method of fiber translation, the facing surfaces 18 are offset laterally. As used herein, the term "laterally offset" means sliding the facing surfaces 18 laterally from their superimposed position to increase the spacing between the fiber cores, while maintaining a substantially parallel relationship between the fibers 12. Such lateral offset of the facing surfaces 18 is illustrated schematically in FIG. 11. The effect of such lateral offset is, of course, to change the spacing between the cores of the fibers 12.

Figure 12:
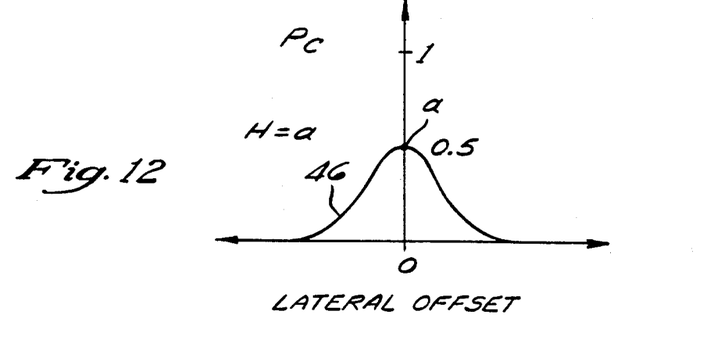
FIG. 12 is a graph of normalized coupled power as a function of lateral offset for a first minimum fiber core spacing.

The curve 46 of FIG. 12 graphically illustrates the effect of laterally offsetting the fiber facing surfaces 18 for a coupler having a minimum edge-to-edge core spacing H equal to "a" (FIG. 10). When the facing surfaces 18 of the fibers are superimposed (i.e., no offset), the normalized coupled power will be equal to 0.5, as required by the curve 44 of FIG. 10. However, when the facing surfaces of the fibers 12 are laterally offset in either direction to increase the spacing between the cores, the coupled power gradually decreases to zero.

Figure 13:
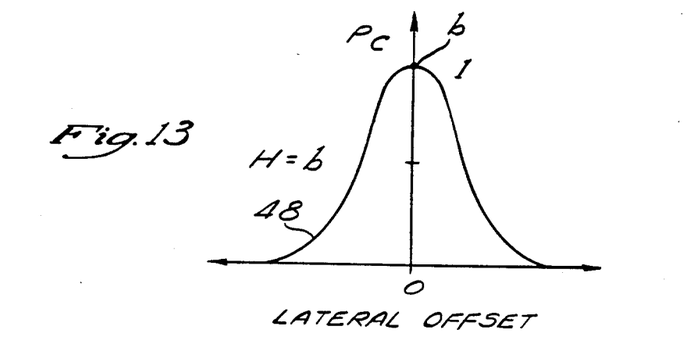
FIG. 13 is a graph of normalized coupled power as a function of lateral offset for a second fiber core spacing.

Referring now to the curve 48 of FIG. 13, the effect of lateral fiber offset upon normalized coupled power for a coupler having an edge-to-edge core spacing equal to "b" (FIG. 10) is shown. When there is no offset and the facing surfaces 18 are superimposed, the normalized coupled power is 1.0, as required by the curve 44 of FIG. 10, however, as the facing surfaces 18 of the fibers 12 are laterally offset in either direction, the coupled gradually decreases.

Figure 14:
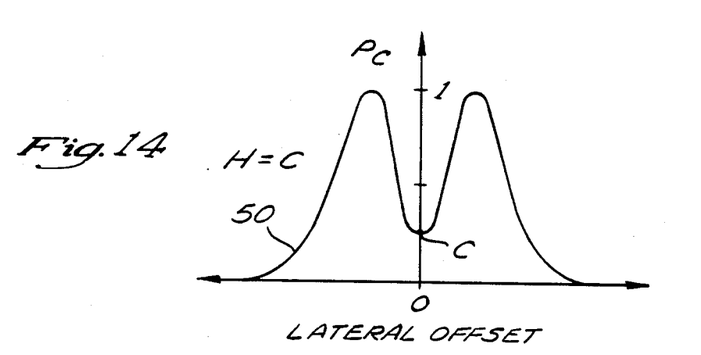
FIG. 14 is a graph of normalized coupled power as a function of lateral offset for a third fiber core spacing.

The curve 50 of FIG. 14 shows coupled power as a function of relative fiber offset for a core spacing equal to "c" (FIG. 10), which, as will be recalled, represents an overcoupled condition. From this curve 50, it may be seen that, when the facing surfaces 18 of the fibers 12 are superimposed, the normalized coupler power is 0.25. As the core spacing is increased by sliding the facing surfaces 18 so that they are laterally offset, the normalized coupled power initially increases to 1.0 and then decreases toward zero when the core spacing is further increased.

In all of the foregoing cases illustrated by FIGS. 12, 13 and 14, the coupled power decreases to zero at the substantially same lateral offset, assuming that the physical dimensions of the coupler corresponding to these figures are identical except for their fiber spacing at zero offset. By comparing the curves 46, 48 and 50 of the FIGS. 12, 13 and 14, respectively, it may be seen that the respective slopes of these curves tend to increases as the core spacing decreases. Thus, the sensitivity of the coupler to lateral offset increases as the core spacing decreases. For example, a coupler fabricated to exhibit overcoupling, as in FIG. 14, is significantly more sensitive to lateral offset than coupler having the characteristics shown in either FIG. 12 or 13. This feature of the present invention is quite advantageous, since, in switch applications, low sensitivity and high stability are typically desirable. Thus, a coupler having coupling characteristics similar to those of FIGS. 12 and 13 (i.e., not overcoupled) is more appropriate for these applications.

Figure 15:
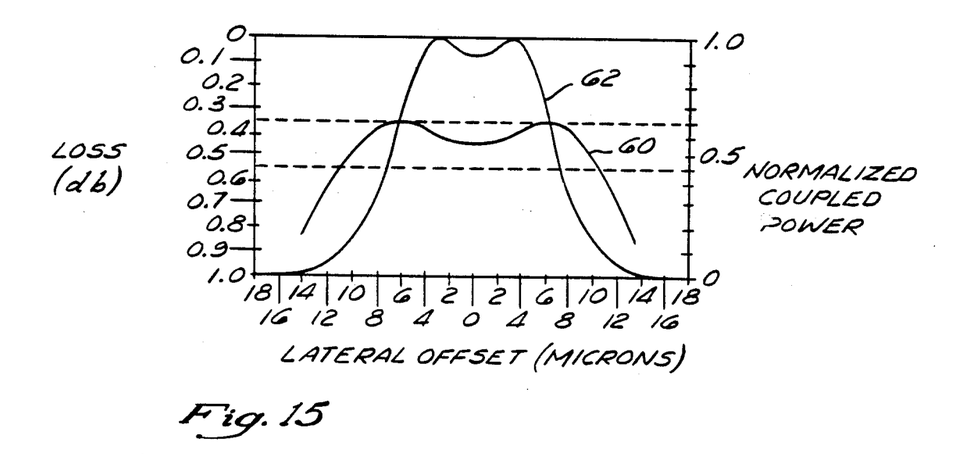

Experimental evidence indicates that the throughput losses of the coupler 10 are substantially constant, except when the lateral offset of the cores is relatively large. Tests on one exemplary coupler showed that the throughput loss was within 0.2 dB of the minimum loss for a lateral offset of up to 10 microns in either direction. This coupler utilized a single mode fiber having a core index of 1.460, a cladding index of 1.4559, and a core diameter of four microns. The radius of curvature of the fibers was 25 centimeters, the edge-to-edge core spacing was approximately 0.9 microns, and the wavelength of the light utilized was 632.8 nm. FIG. 15 shows, for this exemplary coupler, a graph of throughput loss, designated by the reference numeral 60, and a graph of the normalized coupled power, designated by the reference numeral 62, both as a function of lateral offset of the facing surfaces 18. The two horizontal broken lines drawn through the center of FIG. 14 provide the upper and lower boundaries of an 0.2 dB power loss band. It may be seen that the power loss curve 60 is within this band for lateral offsets up to about 12 microns in either direction. Further, it may be seen that, at a 12-micron lateral offset, the normalized coupled power is approximately 0.1. Thus, for coupled power between 0.1 and 1, the power loss is within about 0.2 dB of the minimum power loss. If the power loss band is expanded to 0.5 dB, the power loss band is within the 0.5-dB band for fiber offsets of up to 15 microns, which corresponds to a coupled power of less than 0.05 (i.e., 5 percent). Thus, this coupler exhibits substantially constant throughput losses, i.e., within a relatively narrow power loss band width, throughout substantially the entire operating range of the device. Further, it is significant that the throughput losses are very low, and relatively constant for coupled power between ten percent and one-hundred percent.

Figure 16:
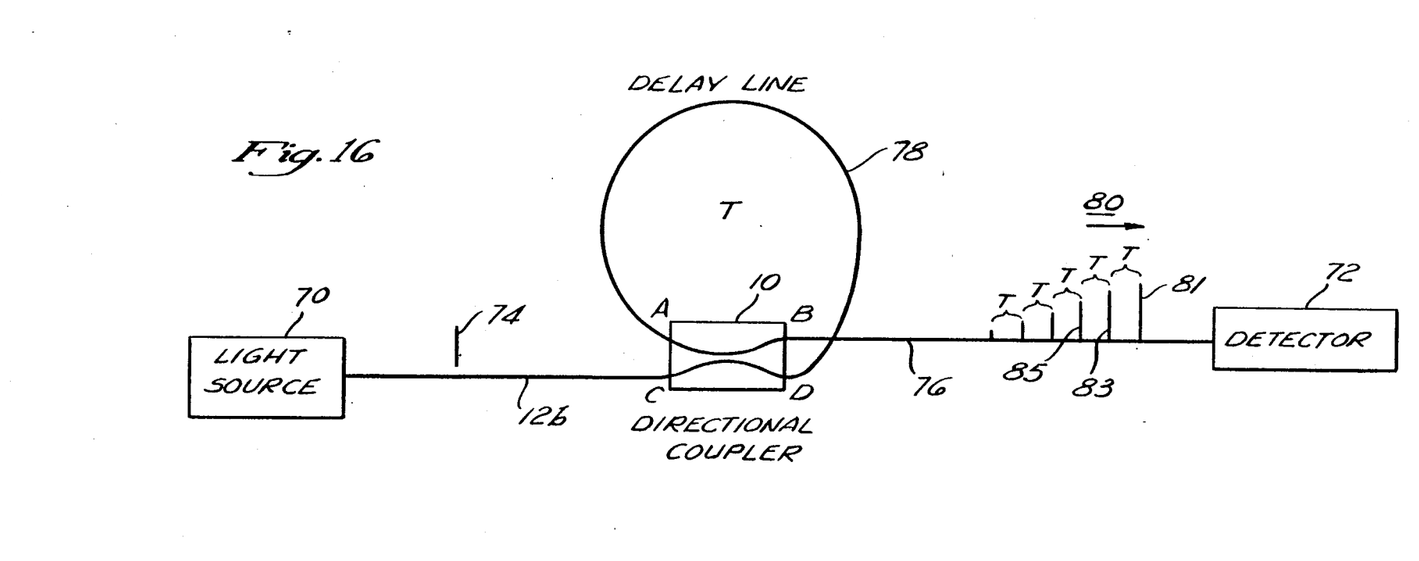
FIG. 16 is a drawing illustrating the structure of a fiber optic delay line and its effect on a single input pulse.

Referring to FIG. 16 there is shown the structure of a fiber optic delay line and its effect on a single input pulses. A light source 70 is coupled to a single mode fiber optic waveguide 12b. The waveguide 12b could be a multimode fiber, but multimode fibers have well known dispersion problems which would limit the bandwidth of the system. Monomode fibers are preferred.

The waveguide 12b enters the directional coupler 10 at the port C and exits at the port D. The fiber is then coiled into a loop of a predetermined length and re-enters the directional coupler 10 at a port A. The fiber then continues through the coupler 10 and exits at a port B which is the output port from the delay line. The output fiber is coupled to a detector 72 such as a standard photodiode.

The delay line of FIG. 16 works as follows. Suppose a single input light pulse 74 is coupled into the input waveguide 12b. As noted above, the coupler 10 can be adjusted such that any amount of power from 0% to 100% may be coupled from the port C to the port B, and into the fiber segment between the port B and the detector 72. This fiber segment will, for convenience, be designated the output fiber 76 although in reality the fiber 12b is continuous, and the output fiber 76 is merely the portion of the fiber 12b between the port B and the detector 72.

The power not coupled from the port C into the output fiber 76, less losses, continues to propagate in the fiber 12b and exits from the port D. This light travels around the delay line loop which for convenience, will be designated as the loop 78, and arrives at the port A of the coupler 10 a time T later. The time delay T is equal to the time it takes for the light to travel around the loop 78.

When the light arrives at the port A, part of it is coupled into the fiber segment between the ports C and D. This part exits from the port D and continues around the loop for a second revolution. The portion of the light that is not coupled back into the loop 78, stays in the output fiber 76 and exits as another pulse in the output pulse train shown generally at 80.

The output pulse train 80 is comprised of an infinite number of pulses of decreasing amplitude. Except for the first pulse, each pulse of the output pulse train 80 represents one trip of the light around the loop 78, and each pulse of the train 80 is separated from its neighboring pulses by the time interval T. The pulses are decaying in amplitude because of losses in the loop 78 and the fact that the coupler 78 couples some portion of the power of each pulse back into the loop on each pass through the coupler for recirculation thereby leaving only the uncoupled portion of the power of each pulse to exit as another pulse in the output pulse train 80.

The output pulse train 80 is comprised of the following pulses. A pulse 81 represents the energy which is coupled from the input pulse 74 into the output fiber 76 which exits from the port B without travelling around the loop 78. A pulse 83 represents the energy from the input pulse 74 which was not coupled into the output fiber 76 as the pulse 81 and which has travelled once around the loop 78 and had part of its energy coupled into the output fiber 76 as the pulse 83. A pulse 85 represents the energy from the pulse 83 that was coupled back into the loop 78 for a second trip around the loop less losses and less the amount of power that is coupled back into the loop for another trip around. This process continues to infinity, but eventually the amplitude of the pulses drops below the noise level, and the pulses effectively disappear.

Figure 17:
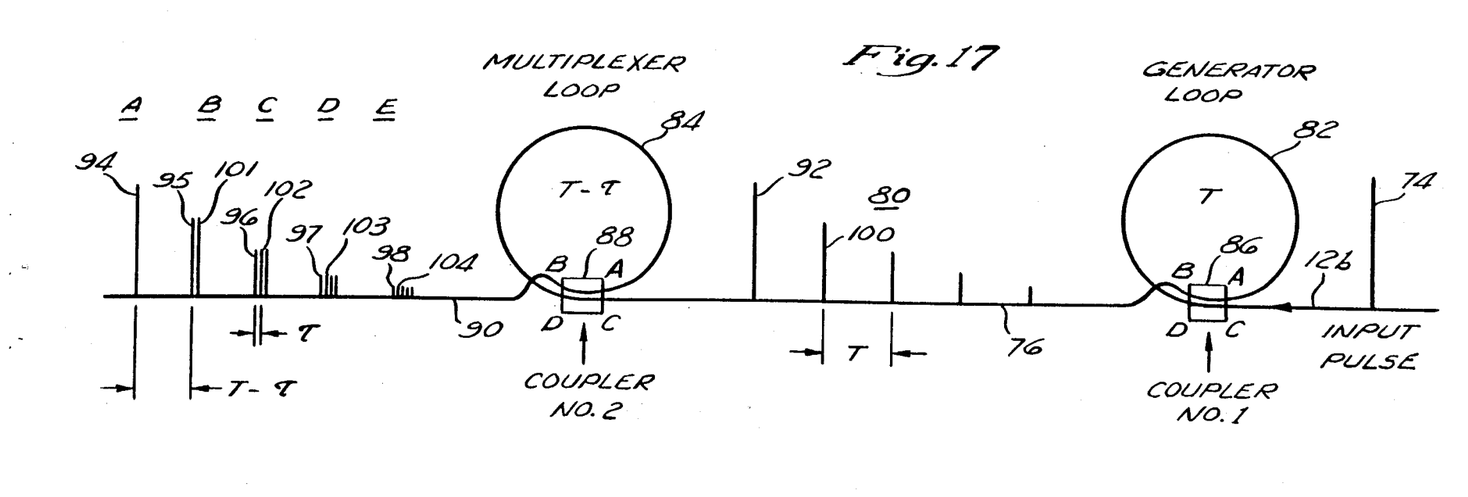
FIG. 17 is a drawing of the preferred embodiment of the high speed pulse train generator.
Figure 18A:
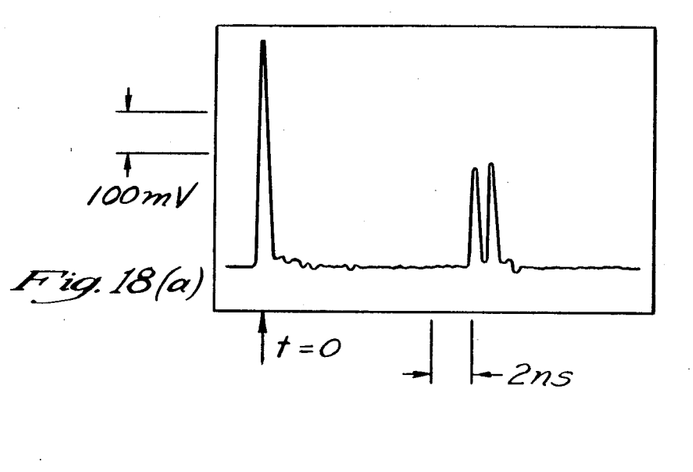
FIGS. 18(a)–18(d) are illustrations of the experimental results obtained from the structure of FIG. 17.
Figure 18B:
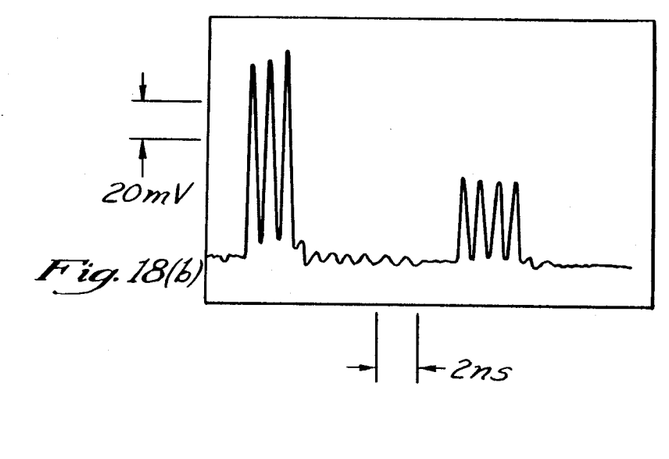
Figure 18C:
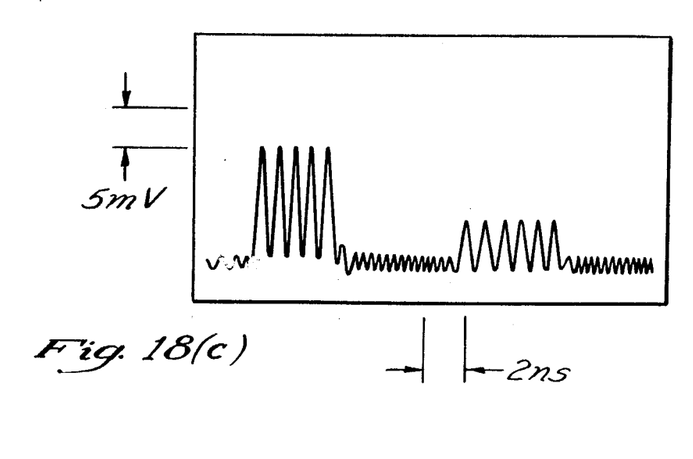
Figure 18D:
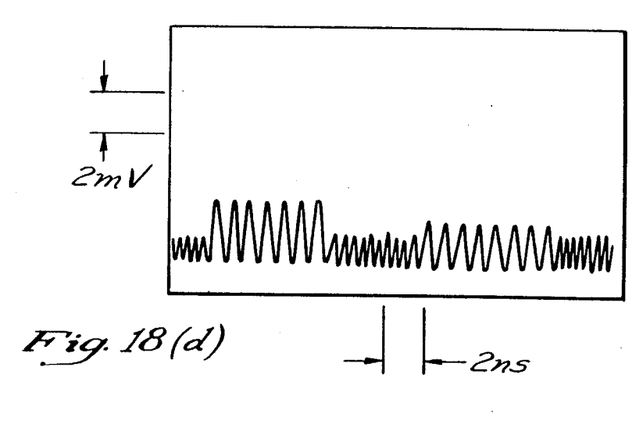

Referring to FIG. 17 there is shown a drawing of the preferred embodiment for the high speed pulse train generator. The system is comprised of two delay line loops similar to the FIG. 16 structure but of unequal length. The loops are a generator loop 82 and a multiplexer loop 84. The generator loop 82 is comprised of the input fiber 12b routed through a first directional coupler 86 in the same fashion as the loop 78 in FIG. 16. The output fiber 76, however, becomes the input fiber for the multiplexer loop 84. That is, the output fiber 76 enters a port C of a second directional coupler 88, exits at a port D, then loops around to the port A to form the loop 84 and exits the coupler 88 again at the port B as an output fiber segment 90 for the system. The length of the two loops 82 and 84 differ by a length such that the transit time through the generator loop 82 is T while the transit time through the multiplexer loop 84 is T-$\tau$ where $\tau$ is small compared to T.

The high speed pulse train generator of FIG. 17 can be used as follows. A single input pulse 74 generates a decaying pulse train 80 in the same fashion as described in connection with FIG. 16. Each pulse in the output pulse train on the fiber 76 creates another decaying pulse train in the output fiber 90 by the action of the multiplexer loop 84 in the same fashion as described with reference to FIG. 16. The start times for these decaying pulse trains on the fiber 90 are staggered by the time T which is the transit time through the generator loop 82. Further, because of the difference in the transit time between the loops 82 and 84, the individual pulse trains are also interleaved to form the subgroups A-E of pulse trains of even amplitude grouped on the output fiber 90. Each of the subgroups is spaced from the others by the time T-$\tau$. Each individual pulse within each of the subgroups A-E is spaced from its neighbor pulse or pulses within the subgroup by the time $\tau$.

More specifically, the decaying pulse train created by the pulse 92 at the input to the multiplexer loop 84 is comprised of the pulses 94-98. The decaying pulse train created by a pulse 100 at the input to the multiplexer loop 84 is comprised of the pulses 101-104. The pulse train 101-104 starts a time T after the pulse train 94-98, but the pulse 95 occurs a time T-$\tau$ after the pulse 94 so the spacing between the pulses 95 and 101 is the time $\tau$. A similar analysis applies for the other pulses at the input.

In FIG. 17, the pulses are propagating from right to left. Therefore, zero time is at the left in the drawing and the pulses would appear at a detector (not shown) coupled to the fiber 90 in the order in which they are drawn reading from left to right. That is, the first pulse which would appear would be the pulse 94. Subsequently, the pulses 95 and 101 would appear in that order. Subsequently, the other pulses would appear in the order in which they are shown.

The staggering of the starting time of the individual decaying pulse trains such as the pulse trains comprised of the pulses 94-98 and pulses 101-104 is caused by the pulse spacing of time T of the input pulse train 80 and by the transit time for the multiplexer loop 84. For example, when the pulse 92 enters the coupler 88, the pulse 94 emerges on the fiber 90 an instant later. A time T-$\tau$ later, the pulse 95 emerges from the port B of the coupler 88 having made one trip around the multiplexer loop 84. A time $\tau$ later, the pulse 101 emerges on the fiber 90 as the first pulse in the decaying pulse train resulting from the input pulse 100 to the multiplexer loop 84.

The pulse 101 completes the subgroup B and is the same amplitude as the pulse 95 under certain conditions. Those conditions are that the coupling and loss parameters of the multiplexer loop 84 must match the coupling and loss parameters of the generator loop 82. This requires that the coupling efficiency (or ratio) of the couplers 86, 88 be equal and that the loop losses, including coupler throughput losses, be equal. When these conditions exist, the pulses in each of the subgroups A-E will be matched in amplitude, because each pulse in a particular subgroup makes the same number of revolutions around either the multiplexer loop 84, the generator loop 82 or a combination of the two. The main factor in matching the amplitudes of the pulses in the subgroups is matching the coupling coefficients of the couplers 86 and 88, because the losses in the loops are small compared to the power coupled back into the loop on each pass through the coupler.

For example, the pulse 95 is the second pulse in the decaying pulse train resulting from the pulse 92 and has made one trip around the multiplexer loop 84. The companion pulse 101 in subgroup B emerges on the fiber 90 a time T after the pulse 94 emerged because the pulse 101 is the direct coupled pulse emerging from the coupler 88 on an instant after its source pulse 100 arrives at the coupler 88. That is, the pulse 101 has not made any revolutions around the multiplexer loop 84, but the source pulse 100 has made one revolution around the generator loop 82. Therefore, both the pulses 95 and 101 have made one revolution around one of the loops 84 or 82. A similar situation can be shown to exist for each of the subgroups A-E. In summary, the output signal on the fiber 90 consists of an infinite sequence of pulse trains, each pulse train (subgroup of equal magnitude pulses) being spaced by the transit time T-$\tau$ of the multiplexer loop from the next pulse train. In general the $N^{th}$ pulse train or subgroup is comprised of N pulses each of which has made N-1 circulations in the multiplexer loop, the generator loop or some combination of the two. N in this case both defines the number of the subgroup starting from the initial, one pulse subgroup A and N defines the number of pulses in the subgroup as well as the number of circulations each pulse has made. Thus, for the first subgroup A with one pulse, N=1 which indicates that A is the first subgroup, that it has one pulse and that the pulse 94 has made no circulations. Likewise, for the subgroup B, N=2 which indicates that subgroup B is the second appearing subgroup, that it has two pulses therein and that each of these pulses 95 and 101 has made one circulation either in the generator loop 82 or the multiplexer loop 84.

The overall decay envelope of the pulse train sequence is described mathematically by equation (1) below. If a single, short pulse having a peak power $P_0$ is launched into the generator loop 82 which loop 82 has a transit time T, the output consists of an infinite series of pulses spaced by T. The peak power of the $N^{th}$ pulse is given by:

$$P_1 = (1 - a_c)\kappa P_0;  \quad (1)$$

$$P_N = (1 - \kappa)^2 \kappa^{N-2} (1 - a_p)^{N-1} (1 - a_c)^N P_0;$$

for
N=2,3 ... where
$a_c$=fractional excess loss of the coupler, i.e., the percentage loss or power out less power in = $-a_c$ times power in; and
$a_p$=the fractional propagation loss per circulation, i.e., similar to the definition for $a_c$; and
$\kappa$=power coupling coefficient of the directional coupler, i.e., coupled power in the second fiber divided by the input power in the first fiber; for example, $\kappa$ for the coupler 88 is the coupled power in the fiber 76 exiting the port C divided by the power in the input fiber 90 entering the port B.

In the preferred embodiment, the coupling coefficient of the couplers 88 and 86 is matched at whatever value is desired to maximize the amplitude of the pulses in the same particular subgroup containing the number of pulses desired. This can be done by solving equation one for the $\kappa$ which maximizes $P_N$. Other coupling coefficients could be used if $P_N$ need not be maximized.

If such a sequence of pulses as the pulse train 80 is coupled into a multiplexer loop having a transit time T-$\tau$, then each pulse of the input sequence enters the loop a time T which is a time $\tau$ after the previous pulse has completed a full circulation. The circulating pulses in the multiplexer loop are thus spaced by T, and are sampled by the coupler on each pass and transmitted to the output. Since the interval $\tau$ between pulses within each subgroup pulse train depends only on the transit time difference between the generator and multiplexer loops 82 and 84, this interval may be arbitrarily short. In fact, $\tau$ is limited only by the width of the original input pulse.

However, the interval T-$\tau$ between the subgroup pulse trains may be much longer thereby enabling the extraction of a desired pulse train, i.e., a subgroup with the desired number of pulses, from the output fiber 90 through a relatively slow gate. That is, a switch can be found which can close sometime during the interval just before the desired subgroup and open sometime during the interval just following the desired subgroup. Thus, any subgroup can be picked at will. While a switch can be found which can discriminate between pulses spaced at T-$\tau$, it would be more difficult to build a switch to discriminate between pulses spaced at $\tau$.

Experimentally the system of FIG. 17 demonstrated the following results. When a short 120 picosecond (full width at half maximum power) pulse of light at a wavelength of 820 nanometers from a laser diode was injected into a generator loop 82 having a transit time of T=10.9 nanoseconds, a 92 megabits/sec pulse sequence that decayed according to equation (1) resulted in the fiber 76.

This pulse sequence on the fiber 76 was injected into a multiplexer loop 84 having a transit time T-$\tau$=10.1 nanoseconds. The transit time difference was therefore $\tau$=0.8 nanoseconds. The coupling and loss parameters were adjusted to be equal in both loops with the adjustable directional couplers 88 and 86 and variable splices within each loop 84 and 82. A variable splice is a splice between two monomode fibers which can have the alignment between the fibers degraded to cause loss in power transfer between the fibers. The resulting output sequence of 1.25 Gigabits per second was detected using a silicon photodiode. FIGS. 18(a)–18(d) illustrate the experimentally observed results from the structure of FIG. 17. Note that the condition of matching of loop losses and coupled power in the couplers 88 and 86 can be checked by observing the evenness of the amplitudes of the pulses within each subgroup. Loop losses can be matched by putting a splice in each loop and adjusting the quality of the splice to match the loss in each loop.

Figure 19:
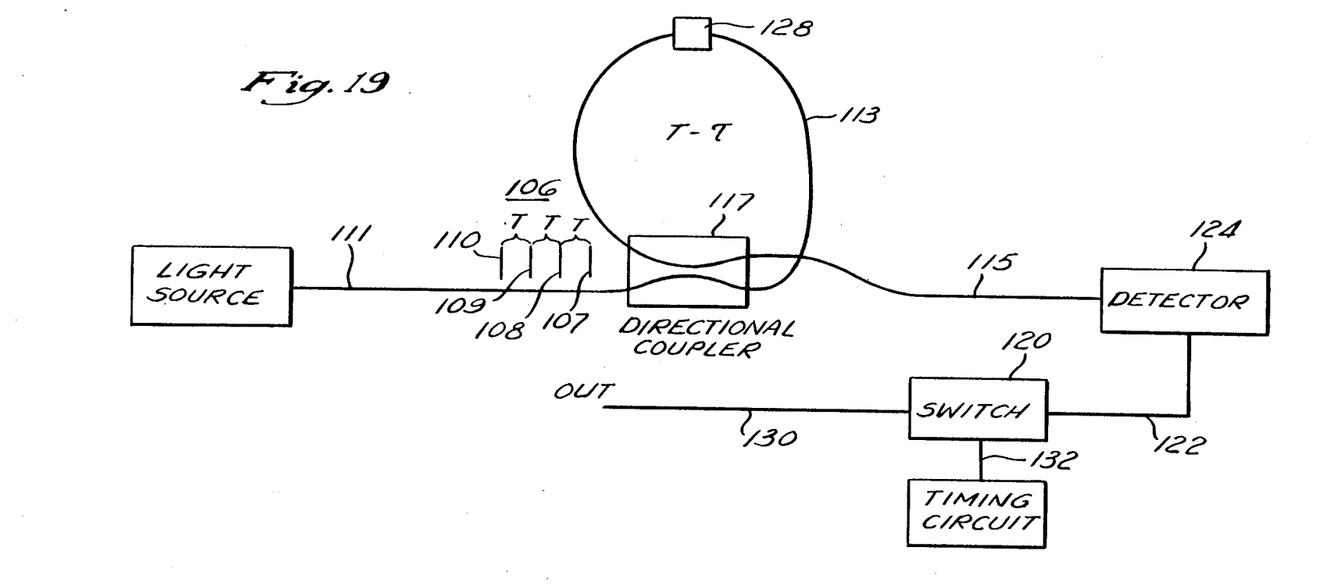
FIG. 19 is a drawing of a single loop embodiment of a data rate transformation device.
Figure 20:
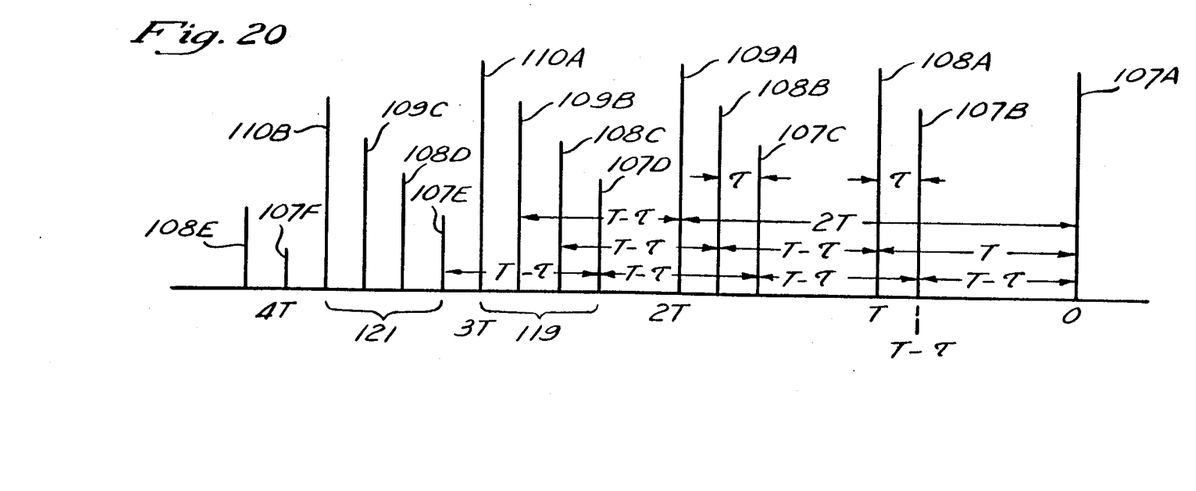
FIG. 20 is a timing diagram illustrating the output pulse sequence resulting from a predetermined input pulse sequence 106.

FIG. 19 illustrates an embodiment of a single loop data rate transformation structure. FIG. 20 is a timing diagram illustrating the sequence of output pulses resulting from the input pulse sequence 106. As explained in conjunction with FIG. 16, each pulse at the input 111 to the delay loop 113 creates a series of decaying pulses at the output 115 which are spaced by the transit time of the loop, T-$\tau$. If the pulses 107–110 in the input pulse train are mutually spaced by T, the output pulse trains are interleaved and spaced as shown in FIG. 20. For convenience, each pulse in the output pulse train generated by each input pulse is numbered with the same reference number as the input pulse with an additional letter appended thereto. The letter indicates how many circulations in the loop 113 that particular pulse made. For example, output pulse 107A results from direct coupling of the pulse 107 to the output 115 without any circulations while output pulse 107B results from the input pulse 107 after having made one circulation. Likewise for each of the other input pulses 108–110. The pulse 107A is spaced from pulse 107B by the transit time, T-$\tau$, of the loop 113 and pulse 107B is similarly spaced from the pulse 107C. Likewise, pulse 108A is spaced from pulse 108B by T-$\tau$, and 108B is spaced by T-$\tau$ from 108C. However, 108A is spaced from 107B by the time $\tau$. This is because just a short time $\tau$ after the pulse 107B returns from its first circulation and appears at the time T-$\tau$ on the output 115, the input pulse 108 arrives at the directional couple 117 and is directly coupled to the output 115. The spacing $\tau$ between the pulses 107B and 108A can be adjusted by changing the loop length to change the time difference $\tau$ between the spacing of the input pulses and the propagation time around the loop relative to the pulse spacing of the input pulse train.

It can be seen from FIG. 20 that the time interval 119 contains one pulse representing each of the four input pulses but spaced at intervals of time $\tau$. A switch 120 coupled to the electrical output line 122 of a photodiode detector 124 can, under the control of a timing circuit 126, select only the pulses occurring during the time interval 119 from the pulse train on the output fiber 115. The structure of such a switch circuit 120 and timing circuit 126 will be apparent to those skilled in the art.

If the input pulse train 106 (FIG. 19) represents a data word coming into the delay loop 113 at a first data rate, then the output pulse train found in the interval 119 represents the same data word on the output 115 (FIG. 19) at a second, higher data rate. If logical 1's and 0's are represented by the presence or absence of pulses during a time slot then, the pulse train found in the time interval 119 will suffice to communicate the data. However, if the amplitude of the individual pulses in the input pulse train must exactly match the corresponding amplitudes in the output pulse train, then the pulse train in the interval 119 may be inadequate. This is because the pulses in the interval 119 do not match the amplitudes of the corresponding input pulses because some of the pulses have suffered more circulation and coupling loss than others.

This situation could be remedied by adding an amplifier 128 to the delay loop of FIG. 19 to compensate for losses in the system. The preceding discussion assumed that the amplifier had unity gain. If the gain of the amplifier is increased to compensate for losses in circulation around the loop and for uncoupled power leaving the loop on the output fiber 115, then no matter how many times a pulse circulates, the output pulse from loop each time a circulating pulse passes through the coupler 117 will be equal to the amplitude of the corresponding input pulse. That is, each input pulse will generate a pulse train of output pulses which match the amplitude of the input pulse.

Any amplifier structure that has sufficient band width for data rates characterized by the time difference $\tau$ will suffice. For data rates in the megahertz range, such amplifier structures are well known to those skilled in the art. Such an amplifier structure could be a photodetector in the loop 113 coupled to the input of a conventional electronic amplifier. The output of the amplifier could then drive a semiconductor laser to couple amplified light pulses back into the loop.

It can be seen from FIG. 20 that the spacing between the last pulse 110A in the pulse train in the interval 119 is only the small time $\tau$ from the first pulse 107E in the next interval 121. This occurs when, as in FIG. 20, $\tau$ is selected to be 20% of T. If $\tau$ is substantially smaller, then the spacing between the last pulse in the interval 119 and the first pulse in the interval 121 will become larger. This condition makes it easier for the switch 120 to discriminate between the last pulse in the interval 119 and the first pulse in the interval 121.

Of course as $\tau$ is made smaller, the bandwidth of the amplifier 128 must be increased because the width of the pulses must be decreased accordingly. For data rates in the gigahertz range, the amplifier 128 could be an optical amplifier such as the amplifier discussed in Volume QE-19, Number 7 of the I.E.E.E. Journal of Quantum Electronics in an article entitled "Analysis of a Multistable Semiconductor Light Amplifier" at page 1184 which article is hereby incorporated by reference. Another structure for the amplifier 128 could be a semiconductor laser with the mirrors therein antireflectively coated so that the reflections characteristic of lasing action do not occur sufficiently to cause laser action. Thus the semiconductor body acts as a channel with gain. In such an embodiment, a population inversion of excited electrons would have to be created as by injecting an excitation current in the form of a c.w. current or a pulse such that as the pulses to be amplified travel through the channel, they stimulate excited electrons to drop to lower energy states thereby emitting photons which add light to the pulse passing through the channel thereby amplifying it. Further details on this structure and method of amplifying will be apparent to those skilled in the art.

Another amplifier structure which might be used for the amplifier 128 is disclosed in co-pending U.S. patent application Ser. No. 407,136, filed Aug. 11, 1982 entitled Fiber Optic Amplifier. The amplifier has the structure of the directional coupler of FIG. 1 except that one of the single mode optical fibers is doped quartz glass such that it has a core and a cladding while the other fiber is a singe crystal neodymium-ytrium aluminum garnet (ND:YAG) fiber doped to have a core and a cladding. The cores should be suitably small to support only one large core diameter of 10 microns or less and cladding diameter of 125 microns. Theses fibers are positioned together in close proximity as in the optical coupler of FIG. 1.

The ND:YAG crystal fiber is the amplifying medium, and it will be coupled to the fiber of the loop 113 of FIG. 19 such that the pulses circulating in the loop 113 pass through the ND:YAG crystal. The quartz glass fiber carries the pumping illumination. The indices of refraction of the two fibers are substantially identical or identical.

The spacing between the pump fiber and the amplifying fiber and the length of the interaction region 18a are selected such that the optical coupler will provide a high coupling efficiency at the wavelength of the pumping light source but a low coupling efficiency at the wavelength of the signal to be amplified. This results in a coupling of the pumping illumination into the doped amplifying fiber, but substantially eliminates loss to the optical signal which is to be amplified since this signal is not coupled into the pumping fiber.

Because the structure of this amplifier permits the pumping wavelength to be coupled into the amplifying fiber for guiding within the amplifying fiber, the diameter of the ND:YAG amplifying fiber need not exceed the absorption length. This is because the pumping illumination is effectively absorbed in a direction along the axis of the ND:YAG fiber rather than perpendicular to that axis after the pumping light has been coupled into the amplifying fiber. Thus, the pumping illumination can be continuously supplied to the amplifying ND:YAG fiber without interfering with the signal carrying characteristics. Furthermore, because a four-port coupler is used for coupling the pumping illumination to the amplifying fiber, the ends of the amplifying fiber are available for direct signal coupling to the optical fibers within the optical fiber system.

The ND-YAG fiber is doped with a material which will lase at the frequency of the signal to be amplified. The signal to be amplified propagates through the ND-YAG crystal fiber to stimulate emissions of coherent light from the lasing material, resulting in amplification of the signal.

Other amplifier structures for use at high frequencies will be apparent to those skilled in the art.

It is also possible to use the embodiment of FIG. 19 to change the data rate from fast to slow. In such an application, the pulse train 106 entering on the input fiber 111 is comprised of a plurality of pulses separated by a time $\tau$. These pulses enter the loop 113 and circulate around it spaced by the time $\tau$. The loop is again of a length such that the circulation time is T-$\tau$. An output pulse train at a slower data rate having pulses spaced T seconds apart can be obtained by picking only one pulse out of the circulating group on each circulation.

That can be done either by predetection switching or by post detection switching. The structure described in FIG. 19 will suffice for post detection switching applications. The structure acts just as described with reference to FIG. 19. However, the switch 120 and timing circuit 126 are modified to open and close the electrical path between the detector 124 electrical output line 122 and the system output line to select only certain of the pulses on the line 122.

Figure 21:
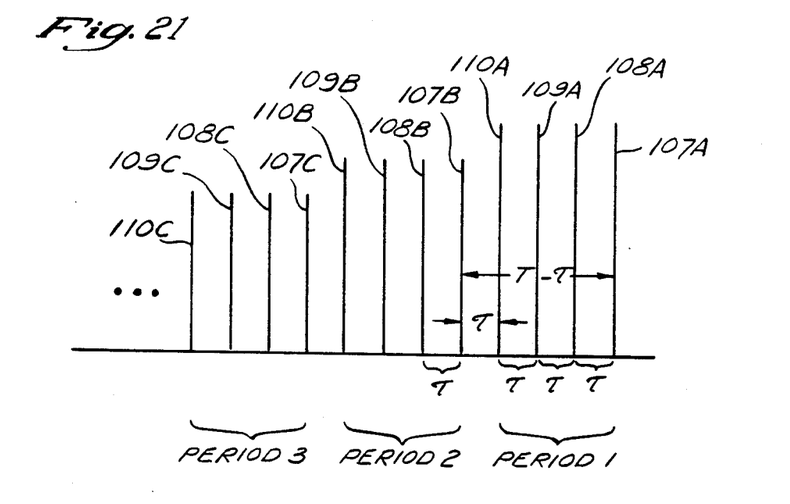
FIG. 21 is a timing diagram of the intermediate output from the loop of FIG. 19 for a fast-in, slow-out embodiment of the invention.

Referring to FIG. 21, there is shown a timing diagram of the intermediate output on the line 122 from the detector 124 for the loop 113 of FIG. 19 for a fast-in, slow-out data rate embodiment of the invention. It can be seen from FIG. 21 that the pulses 107-110 emerge from the loop 113 in the exact spacing that they went in, but that another group of pulses will emerge behind this group after another circulation. That is, the pulses on the line 122, during the period 1, are all spaced by $\tau$ seconds from each other, and they result from direct coupling from the input fiber 111 to the fiber 115 in the directional coupler 117. However, T-$\tau$ seconds later the first pulse of the second group emerges, the group now having almost completed one revolution through the loop 113. The spacing between the pulses 110A and 107B is only $\tau$ seconds but could be larger if t were made larger relative to T. The same pulse marking conventions are used in FIG. 21 as were used in FIG. 20.

The pulses that emerge on the fiber 115 then represent the input pulse train after one revolution. Likewise, the pulses which emerge during the period 3 represent the input pulse train after it has made two revolutions through the loop 113. The pulses of FIG. 21 are shown as decaying in amplitude based on the assumption that no amplifier 128 is in the loop 113. However, if an amplifier is present in the loop 113, then the pulses emerging during the periods 2 and 3 will be of the same amplitude as the pulses during the period 1.

Figure 22:
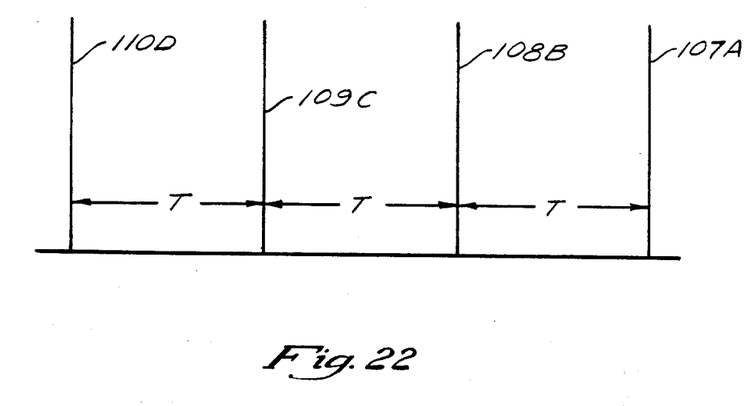
FIG. 22 is a timing diagram for the final output on the line 130 for the fast-in, slow-out embodiment of FIG. 19.

It can be seen from examination of FIG. 21 that the pulses 107A and 108B are separated by T seconds as are the pulses 108B and 109C and so on. Thus, if the switch 120 can be closed during only those time periods to admit the pulses 107A, 108B, 109C and 110D, then a pulse train like that shown in FIG. 22 will result, assuming that an amplifier 128 is in the loop 113. Thus, a pulse separation of T seconds on the output will have been achieved for an input pulses train pules separation of $\tau$ seconds.

Of course, for very high data rates, the switch 120 will have to be very fast to be able to turn off and on during times on the order of $\tau$. However, such fast switches are known. For example, devices like Josephson's junctions can be used. The manner of use of such switches will be apparent to those skilled in the art. Also, very high speed integrated circuits such as those developed for the Defense Department during the VHSIC program may also be used for the switch 120 as will be apparent to those skilled in the art. The switch 120 can be driven by the timing circuit 126 by pairs of narrowly-spaced pulses spaced by times on the order of $\tau$. The timing circuit can generate these pulses using the apparatus of FIG. 17. Suitable timing arrangements will be apparent to those skilled in the art.

Alternatively, the switching could be done prior to detection by using a different type of directional coupler for the coupler 117. Such a coupler as is described in High Technology magazine for November/December, 1982, pages 35-43, at page 40 in an article entitled "Future Looks Bright For Guided Wave Optics" by Robert Haavind will be adequate. The details of this article are incorporated by reference herein. Briefly, this coupler is comprised of two optical waveguides formed by diffusing an impurity such as titanium into a crystal block of lithium niobate. The geometry of the waveguides is such that they are brought to within approximately 5 micrometers of each other for a certain interaction distance. A pair of electrodes is deposited on the lithium niobate crystal with one pair of electrodes over each of the waveguides in the interaction region. Normally the evanescent field of light travelling in one waveguide gets into the other waveguide in the interaction region. Light then begins to build up in the other waveguide. If the interaction region is long enough, then all the light transfers to the other waveguide with only the evanescent field remaining in the original waveguide. If the interaction region is longer than the complete transfer length, then the light begins to shift back into the original waveguide. Electrooptic crystals exhibit a property called the Pockels effect which means that an electrical field in the crystal can change the index of refraction in the crystal. This effect is used in the above described coupler by applying an electric field which is oriented up in one waveguide and down in the other waveguide. This alters the refractive index and can prevent power transfer. The electrodes can be driven with suitable signals to cause the coupler to switch only certain of the circulating pulses out of the loop thereby changing the data rate. Thus, the coupling from the loop 113 to the fiber output waveguide 115 can be made selectively at times controlled by the application of suitably timed electrical signals. In such an embodiment, the timing circuit 126 can be as described above except that its electrical output signals on a line 132 will be coupled to the coupler described above and substituted for the coupler 117 in FIG. 19. Thus, the pulses 107A, 108B, 109C and 110D can be coupled out of the loop 113 by use of suitably timed signals to the coupler.

Although the invention has been described in terms of the embodiments, disclosed herein, many modifications will be apparent to those skilled in the art. All such modifications are intended to be included within the scope of the claims appended hereto.

What is claimed is:

1. An apparatus for generating a pulse train comprising:
   a first fiber optic delay line for receiving an input pulse and for generating an input pulse train from said input pulse; and
   a second fiber optic delay line connected to receive said input pulse train from said first delay line, said second delay line imposing a predetermined delay on the pulses of said input pulse train to cause interleaving of said pulses for generating an interleaved output pulse train from said input pulse train.

2. An apparatus as defined in claim 1 wherein said second delay line imposes a different delay time than said first delay line, said different delay time of a duration to generate said interleaved pulse train.

3. An apparatus as defined in claim 2 wherein each of said first and second delay lines comprises a loop of optical fiber, each said loop being optically closed by a coupling means.

4. An apparatus as defined in claim 3 wherein the coupling ratio of each said coupling means is substantially the same.

5. An apparatus as defined in claim 3 wherein each said coupling means comprises a fiber optic directional coupler.

6. An apparatus as defined in claim 1 further comprising an amplifier in at least one of said delay lines.

7. An apparatus as defined in claim 6 wherein each of said delay lines comprises a spliceless monomode fiber optic waveguide which forms a loop that is closed by a directional coupler.

8. An apparatus as defined in claim 7 wherein said amplifier is an optical amplifier.

9. An apparatus as defined in claim 1 further comprising:
   a detector coupled to receive pulses output from one of said delay lines and having an electrical output; and
   a switch coupled to said electrical output for selecting for output only pulses occurring on said electrical output during predetermined times.

10. An apparatus as defined in claim 9 wherein each of said delay lines includes a directional coupler.

11. An apparatus comprising:
    a first fiber optic delay line including a first fiber optic directional coupler; and
    a second fiber optic delay line connected to said first delay line, said second delay line including a second fiber optic directional coupler,
    said first and second couplers having substantially the same coupling ratio so as to produce groups of equal-amplitude pulses from a single pulse input to said first delay line.

12. An apparatus for generating a pulse train, comprising:
    means for generating a series of input pulses with decreasing amplitudes; and
    a fiber optic delay line connected to receive said series of pulses from said generating means for producing an output pulse train group comprising a first series of output pulses, said decreasing amplitudes related so that each of said first series of output pulses within said group has substantially the same amplitude.

13. An apparatus as defined in claim 12 wherein said delay line is a single mode fiber optic waveguide which forms a loop closed by a four port directional coupler.

14. An apparatus as defined in claim 13 wherein said directional coupler closes said loop without splicing said fiber, utilizing evanescent field coupling.

15. An apparatus as defined in claim 12 wherein said generating means is a loop of optical fiber connected to a fiber optic directional coupler.

16. An apparatus as defined in claim 12 further comprising a light amplifier in said delay line.

17. An apparatus as defined in claim 12 further comprising:
    a detector coupled to said delay line for converting light pulses to electrical pulses; and
    a switch means for gating selected ones of said electrical pulses to an output.

18. An apparatus as claimed in claim 12 wherein said output pulse train group additionally comprises a second series of substantially equal-amplitude output pulses, said second series having a different amplitude than said first series.

19. An apparatus for generating a pulse train comprising:
    a first splice-free fiber optic recirculating delay line for recirculating light pulses, said delay line having a length selected to impose a first delay on an input light pulse each time said input pulse recirculates through said delay line, said delay line generating a first train of pulses which are spaced by said first delay; and
    a second splice-free fiber optic recirculating delay line connected to receive said first train of pulses from said first delay line having a length so as to impose a second delay on said first train such that a second train of pulses is generated for each of said pulses in said first train.

20. An apparatus as defined in claim 19 wherein each of said second trains from said second delay line is interleaved by an amount of time equal to the difference between said first and second delays.

21. An apparatus as defined in claim 19 or 20 wherein each of said first and second fiber optic delay lines includes a fiber optic directional coupler, said couplers having substantially the same coupling ratio.

22. A method of producing groups of equal-amplitude pulses comprising:
    introducing an input pulse train into an input waveguide, each successive input pulse of said input train having an amplitude smaller than that of the previously input pulse of said input train so that the amplitude of said input train decreases with time; and
    generating an output pulse train for each of said input pulses and interleaving said output pulse trains to generate groups of equal-amplitude pulses.

23. The method of claim 22 wherein the step of introducing an input pulse train into an input waveguide comprises the step of introducing a single pulse into a first recirculating fiber optic delay line having a first propagation delay to produce said input pulse train.

24. The method of claim 23 wherein the step of generating an output pulse train for each of said input pulses comprises the step of introducing said input pulse train into a second fiber optic delay line having a second propagation delay, said second propagation delay different from said first propagation delay.

25. The method of claim 24 wherein said second propagation delay is less than said first propagation delay.

26. The method of claim 25 further comprising the step of substantially matching the coupling ratios of said first and second fiber optic recirculating delay lines.

27. The method of claim 24 further comprising the step of adjusting said first propagation delay relative to said second propagation delay so as to interleave said output pulse trains by a predetermined amount.

28. A method of generating a pulse train comprising the steps of:
    introducing an input pulse into a first fiber optic delay line having a first propagation delay to produce an input pulse train; and
    introducing said input pulse train into a second fiber optic delay line with a second propagation delay to produce an output pulse train for each pulse in said input pulse train to produce an interleaved output pulse train.

29. The method of claim 28 wherein each of said delay lines includes a fiber optic directional coupler.

30. The method of claim 29 wherein one of said couplers is a switchable coupler, additionally comprising the step of applying electrical signals to said switchable coupler to prevent at least one pulse in said pulse trains from being output.

31. The method of claim 28, additionally comprising the steps of:
    detecting said pulses in said output pulse train and generating an electrical pulse for each; and
    gating certain of said electrical pulses through to an output.

32. The method of claim 28 wherein said second propagation delay is less than said first propagation delay.

* * * * *